United States Patent [19]

Motley et al.

[11] Patent Number: 4,726,029
[45] Date of Patent: Feb. 16, 1988

[54] ERROR-CORRECTING MODEM

[75] Inventors: David M. Motley, Santa Ana; John F. Stockman, Costa Mesa, both of Calif.

[73] Assignee: Hycom Incorporated, Irvine, Calif.

[21] Appl. No.: 774,298

[22] Filed: Sep. 10, 1985

[51] Int. Cl.$^4$ .................... H04L 1/00; G08C 25/00
[52] U.S. Cl. ........................... 371/46; 371/35; 375/116
[58] Field of Search .................. 371/22, 35, 46, 47, 371/44, 45; 375/1, 116; 178/22.17; 380/48

[56] References Cited

U.S. PATENT DOCUMENTS

| | | | |
|---|---|---|---|
| 3,585,586 | 6/1971 | Harmon | 371/44 X |
| 3,789,359 | 1/1974 | Clark | 371/46 |
| 3,893,072 | 7/1985 | D'Antonio | 371/30 |
| 3,988,539 | 10/1975 | Motley | 375/39 X |
| 4,383,322 | 5/1983 | Halpern | 375/112 X |
| 4,507,779 | 3/1985 | Barner | 371/47 X |
| 4,539,684 | 9/1985 | Kloker | 371/46 |
| 4,586,182 | 4/1986 | Gallager | 371/30 |
| 4,603,413 | 7/1986 | Sinjou | 371/4 |
| 4,646,305 | 2/1987 | Tretter | 371/43 |

Primary Examiner—Jerry Smith
Assistant Examiner—Robert W. Beausoliel, II
Attorney, Agent, or Firm—Weissenberger and Peterson

[57] ABSTRACT

Error multiplication in the differential decoder and descrambler of V.22 bis modems is avoided by replacing the differential coding with forward error correction and single symbol coding. The error syndrome bit of the error corrector is used in establishing phase and timing synchronization by causing the receiver to try all possible combinations of phase and timing, and to lock onto the combination which produces a minimum of error syndrome bits. The descrambler receives the error-free corrected bit stream, whereby the descrambler's inherent error multiplication becomes moot.

9 Claims, 8 Drawing Figures

|  | PHASE CHANGE | |  |  | PHASE CHANGE | |
|---|---|---|---|---|---|---|
| BITS | FROM QUAD | TO QUAD | | BITS | FROM QUAD | TO QUAD |
| 00 | 1 | → 2 | | 11 | 1 | → 4 |
|  | 2 | → 3 | |  | 2 | → 1 |
|  | 3 | → 4 | |  | 3 | → 2 |
|  | 4 | → 1 | |  | 4 | → 3 |
| 01 | 1 | → 1 | | 10 | 1 | → 3 |
|  | 2 | → 2 | |  | 2 | → 4 |
|  | 3 | → 3 | |  | 3 | → 1 |
|  | 4 | → 4 | |  | 4 | → 2 |

FIG. 2a
PRIOR ART

```
        5       6    |   1       2
        •       •    |   •       •
        11      01   |   10      11
QUAD 2                              QUAD 1
        7       8    |   3       4
        •       •    |   •       •
        10      00   |   00      01
   ──────────────────┼──────────────────
        9       10   |   13      14
        •       •    |   •       •
        01      00   |   00      10
QUAD 3                              QUAD 4
        11      12   |   15      16
        •       •    |   •       •
        11      10   |   01      11
```

ERROR-CORRECTING MODEM

FIELD OF THE INVENTION

This invention relates to error-correcting modems, and more particularly to an arrangement for greatly improving the error-correcting capability of a modem using forward error correction.

BACKGROUND OF THE INVENTION

CCITT V. 22 bis modems operating over the telephone network transmit information in the form of symbols identified by both a specific phase shift from one symbol to the next and a particular amplitude relationship. At the receiving end, the transmitted information can be recovered by detecting changes in the phase and amplitude of the incoming signal. Each symbol may typically represent several bits of data.

For a variety of reasons, errors in symbol recognition occur from time to time at the receiving end, often in the form of short error bursts involving fewer than two or three symbols. Forward error correction (FEC) algorithms have been devised to recognize and correct such errors by transmitting extra bits (termed error check bits) derived from a combination of delayed and undelayed data bits. At the receiving end, a similar combination can be used to generate error syndrome bits. The error syndrome bits can be used in a conventional error-correcting logic to recreate the original data train even though some bits may have become garbled during transmission. The FEC algorithm is most efficiently implemented in the form of a convolutional encoder/decoder.

The nature of FEC is such that an error burst of given length can only be corrected after the reception of an error-free guard space whose length is mathematically related to the length of the error burst. In practice, there is one FEC algorithm that can correct a 12-bit burst following a guard space of 191 error-free bits.

Unfortunately, high-speed modems require the use of certain functions which multiply the number of errors caused by the reception of a single erroneous bit. Specifically, the descrambler necessitated by the use of adaptive equalization on poor-quality telephone lines produces as much as three errors for each erroneous bit appearing at its input, while the differential decoder which decodes the received symbols upstream of the descrambler produces at least two errors for each erroneous received bit. Thus, even a one-bit error in a single received symbol typically produces six errors at the output of the descrambler, or half the entire error-correcting capacity of the above-mentioned FEC algorithm. The effectiveness of the FEC would therefore be highly increased if this error multiplication could be avoided.

SUMMARY OF THE INVENTION

The present invention eliminates the error multiplication of the prior art by placing the FEC encoder/decoder inside the scrambling operation, by eliminating the differential coding and by using the FEC error syndrome bit to provide the necessary phase synchronization. This not only eliminates the error multiplication caused by the differential decoder, but also eliminates the descrambler's error multiplication.

In a preferred embodiment of the invention, sixteen different vector symbols can be transmitted. Each symbol represents one of the sixteen possible binary four-bit blocks. The output of the FEC decoder in this embodiment, however, is a six-bit group (five data bits plus the error check bit). When such six-bit groups are transmitted four bits at a time, a timing ambiguity arises. For example, if the six FEC encoder output bits are A, B, C, D, E and F, the receiver has no way of determining from the received symbols themselves whether any given four-bit symbol contains ABCD, CDEF, or EFAB. In order to correctly identify the bits of each symbol, the receiver must therefore establish a timing reference.

Consequently, in order to synchronize the receiver in the preferred embodiment, two questions have to be resolved: (1) which symbol of each three-symbol sequence received contains the first four bits of a six-bit group? (2) what is the correct reference phase from which the phase of received symbols is to be measured? As long as either question is incorrectly resolved, a large number of error syndrome bits will occur and will thus indicate an out-of-synch condition. It is therefore possible to determine both the correct timing reference and the correct phase reference by varying these factors until the number of error syndrome bits becomes zero or at least very small. Inasmuch as there are only three possible timing references and four possible phase references, and all four phase references can be tested simultaneously with each timing reference at computer speeds, synchronization can rapidly be achieved at any time.

It is thus the object of the invention to improve the effectiveness of forward error correction in a V.22 bis-type modem by substituting single-symbol algebraic amplitude coding for the conventional differential phase encoding, and to use the error syndrome bit of the FEC algorithm to provide both timing and phase synchronization for the modem's receiver.

BRIEF DESCRIPTION OF THE DRAWINGS

FIGS. 2a and 2b are code charts illustrating a combined differential and amplitude coding technique of the prior art;

FIG. 5 is a constellation diagram illustrating the sixteen possible vector symbols which can be transmitted in the preferred embodiment;

DESCRIPTION OF THE PREFERRED EMBODIMENT

Figure 1:
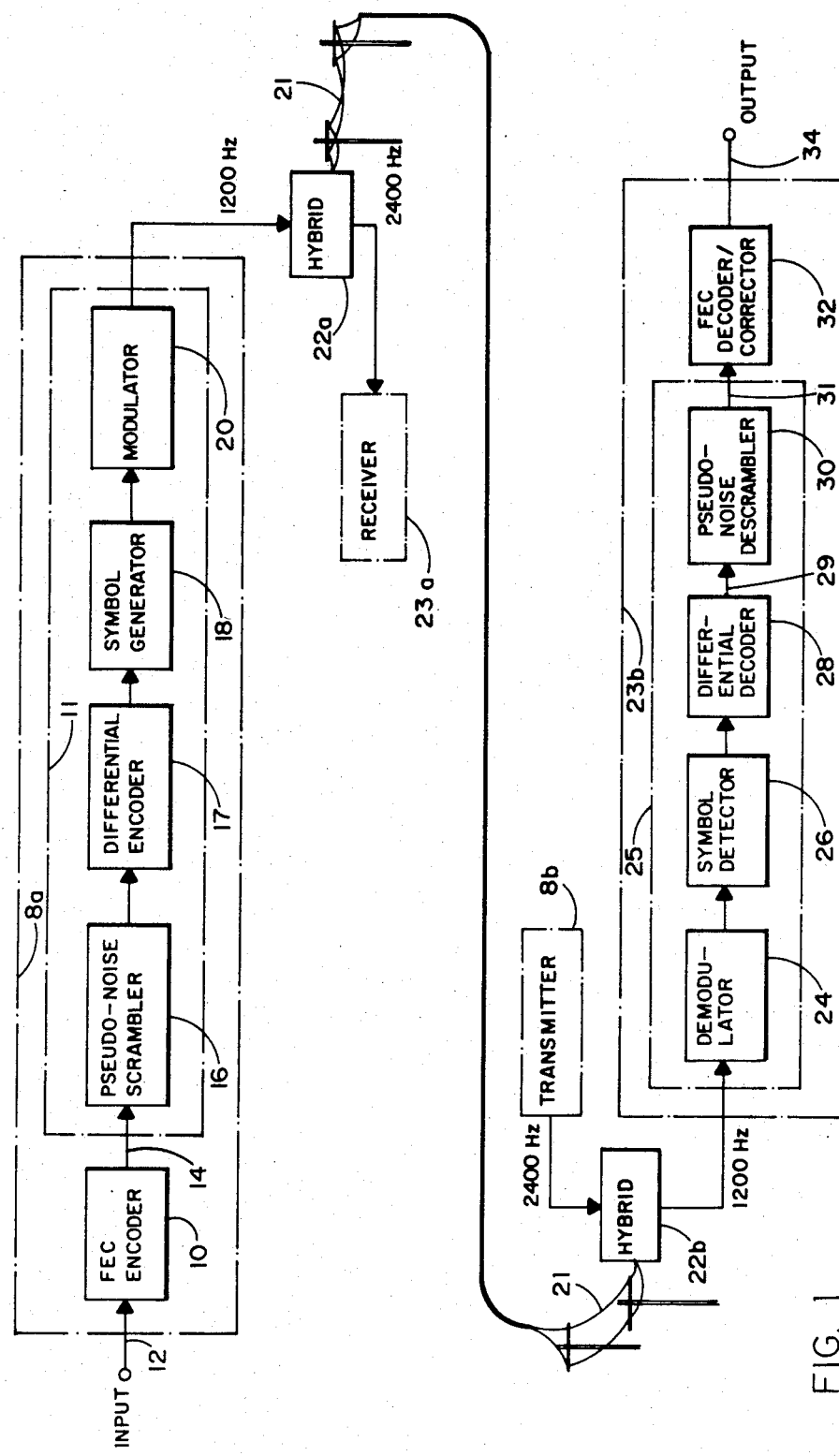
FIG. 1 is a block diagram of a prior art full-duplex modem using forward error correction.

FIG. 1 illustrates a conventional modem pair using FEC. Only those components used in a transmission from transmitter 8a to receiver 23b are shown in detail, but it will be understood that the components used in a transmission from transmitter 8b to receiver 23a would be identical although operating at a different carrier frequency, e.g. 2400 Hz vs. 1200 Hz.

A convolutional FEC encoder 10 associated with the transmitter 8a receives the input data train 12 at, for example, 2000 bits per second and produces a convolutionally encoded data train 14 of higher bit rate (for example 2400 bps) which contains the data bits of data train 12 as well as error check bits generated by the encoder 10. In the transmit section 11 of the modem itself, the data train 14 is randomized for equalization purposes in a psuedo-noise scrambler 16, and is then encoded in a differential encoder 17 and converted to vector-type symbols in a symbol generator 18. The vector coordinate output of symbol generator 18 is used to modulate and process a carrier in accordance with known techniques in the modulator 20. The modulated carrier is then transmitted over a telephone line 21 via a hybrid 22a.

FIGS. 2a and 2b illustrate the use of differential encoding in the prior art. In one possible coding technique, a sixteen-vector constellation is divided into four quadrants (FIG. 2b). The first two bits of the four-bit group corresponding to each received symbol are detected as a phase change from one quadrant to another as illustrated in FIG. 2a, while the last two bits are decoded as specific arithmetic amplitude states in the real and imaginary domains (FIG. 2b). Because the first two bits represent a quadrant change rather than a specific quadrant, and the amplitude coordinates are measured from a common point in all four quadrants, no phase synchronization is required in the prior art technique of FIGS. 2a and 2b.

In the receive section 25 of the modem, the incoming carrier from hybrid 22b is processed and demodulated in demodulator 24. The vector coordinates detected by the symbol detector 26 are applied to a differential decoder 28 whose output 29 is a duplicate of the randomized data train put out by the scrambler 16.

A descrambler 30 converts the randomized data train back into a duplicate 31 of the 2400 bps modem bit rate data train 14. When this data train is applied to the convolutional decoder/error corrector 32, which completes the receiver 23b, any erroneous data bits within the correction capability of the FEC algorithm are corrected, and a 2000 bps output data train 34 identical to the input data train 12 is produced.

The differential decoder 28 produces an output based in part upon the phase difference between the current symbol and the preceding symbol. Assuming that the transmitter makes no errors, a phase error in one received symbol will therefore produce at least two output errors. The descrambler 30 typically uses a modulo-2 combination of the current bit with two delayed bits delayed by different amounts. Consequently, each erroneous bit at the input of the descrambler 30 will produce as many as three erroneous bits at its output. Thus, in the prior art described above, a single phase error in the received symbol train will normally produce six data errors which must be corrected by the convolutional decoder 32.

Figure 3:
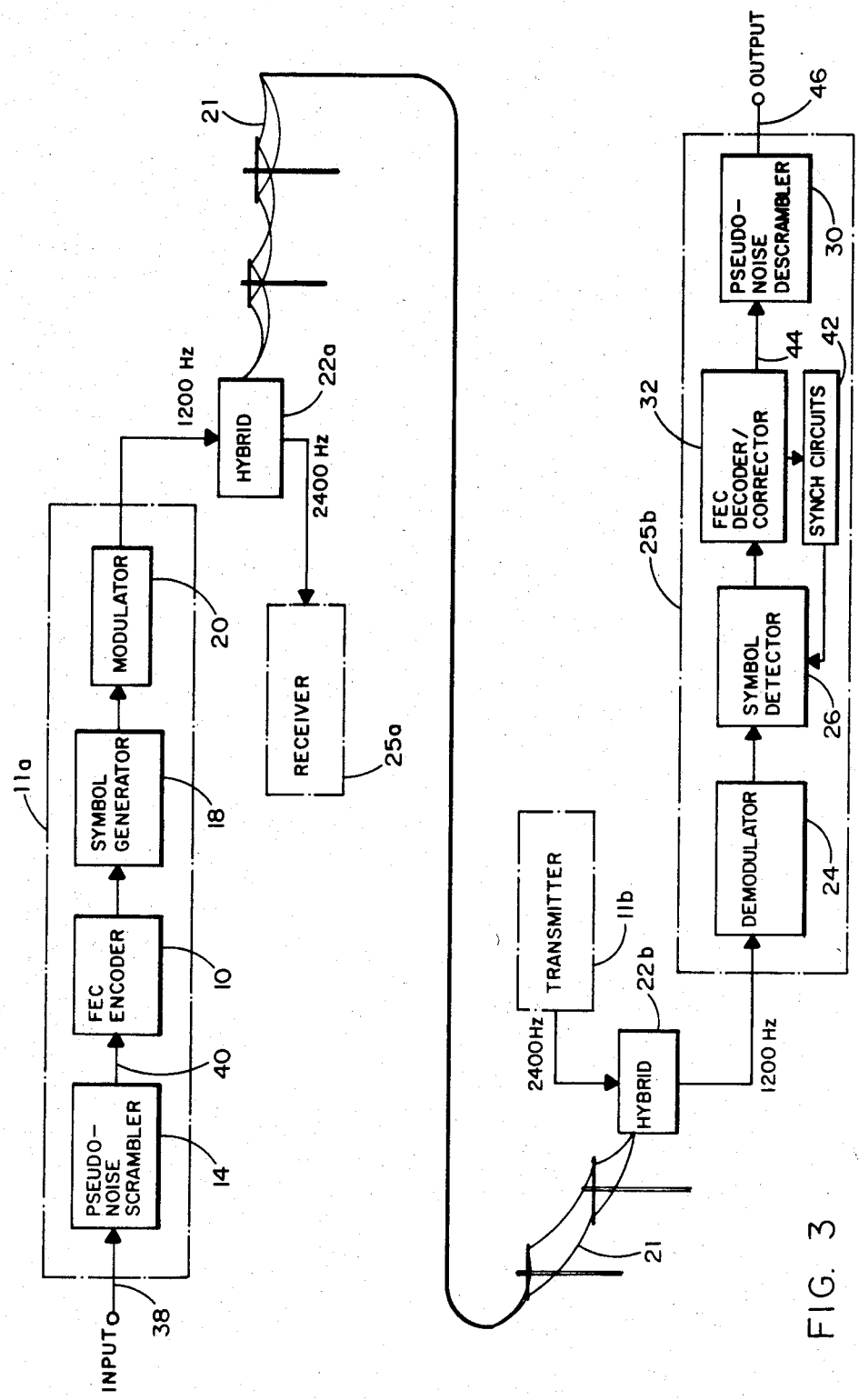
FIG. 3 is a block diagram similar to FIG. 1 but showing the modem of this invention.

FIG. 3 illustrates the apparatus by which the invention eliminates this error multiplication. In the transmit section 11a of the modem, the original data train 38 is applied directly to the input of scrambler 14, in which it is randomized by conventional techniques. The randomized data train 40 is applied to the input of the convolutional FEC encoder 10 which is shown in more detail in FIG. 4.

In the described embodiment of the invention, the convolutional coding apparatus uses a (6,5) code in which groups of five bits are combined in a modulo-2 mode with various delayed bits to produce a sixth bit known as the error check bit.

If the input 38 to the convolutional encoder 10 is data at a 2400 bps rate, the output of encoder 10 will be data plus error check bits at a 2880 bps rate. In the described embodiment, this output is converted in four-bit blocks by the symbol generator 18 into vector symbols identified by the algebraic real and imaginary amplitudes of the respective vectors of the sixteen-element constellation shown in FIG. 5. These symbols are then transmitted at a 720-baud rate by the modulator 20.

In the receiver section 25b of the modem of FIG. 3, the conventional symbol detector 26 puts out successive four-bit blocks of data pulses corresponding to the received vector symbols. There is now, however, an ambiguity in the interpretation of the vectors. In the absence of any reference phase (i.e. a reference real axis and positive direction in FIG. 5), a maximum-amplitude signal can represent either 0011, 0111, 1111, or 1011. Therefore, when the modem of this invention is out of phase synch (as indicated by a high percentage of errors), the detector 26 tries each of the four possible reference phases until the cessation of error syndrome bits in the FEC decoder/corrector 32 indicates that it has found the right one. The synch circuits 42 then maintain the correct phase. Once the device of this invention is in phase synch, however, an error in the interpretation of one symbol will normally produce only one erroneous bit, because successive symbols are not compared to each other.

The four-bit blocks of data pulses put out by the detector 26 may contain a further ambiguity. If the data bits of each five-bit group of data train 40 are designated A, B, C, D, and E, and the error check bit for that group is designated F (FIG. 4) there is no way to immediately know, in the absence of a timing reference, whether a given four-bit block put out by detector 26 represents ABCD, CDEF, or EFAB. Consequently, when the receiver section 25b is out of time synch, it shifts its timing reference through the three possible positions until the high percentage of error syndrome bits disappear. The synch circuits 42 then maintain this timing.

Because the effect of the twelve possible combinations of phase and timing references can be tested in the receiver section 25b at computer speeds without actually changing receiver phase or timing, synchronization can be reestablished within a very short time following a loss of synch.

When the correct timing and phase references have been selected, the error-correcting convolutional decoder 32 of FIG. 6 corrects any error bursts which may occur due to transient disturbances in the telephone line which do not violate the guard space, as will be described below. The error-free randomized 2400 bps data train 44 put out by decoder 32 is then applied to the conventional descrambler 30 which reconverts it into an output data train 46 identical to the input data train 38.

Figure 4:
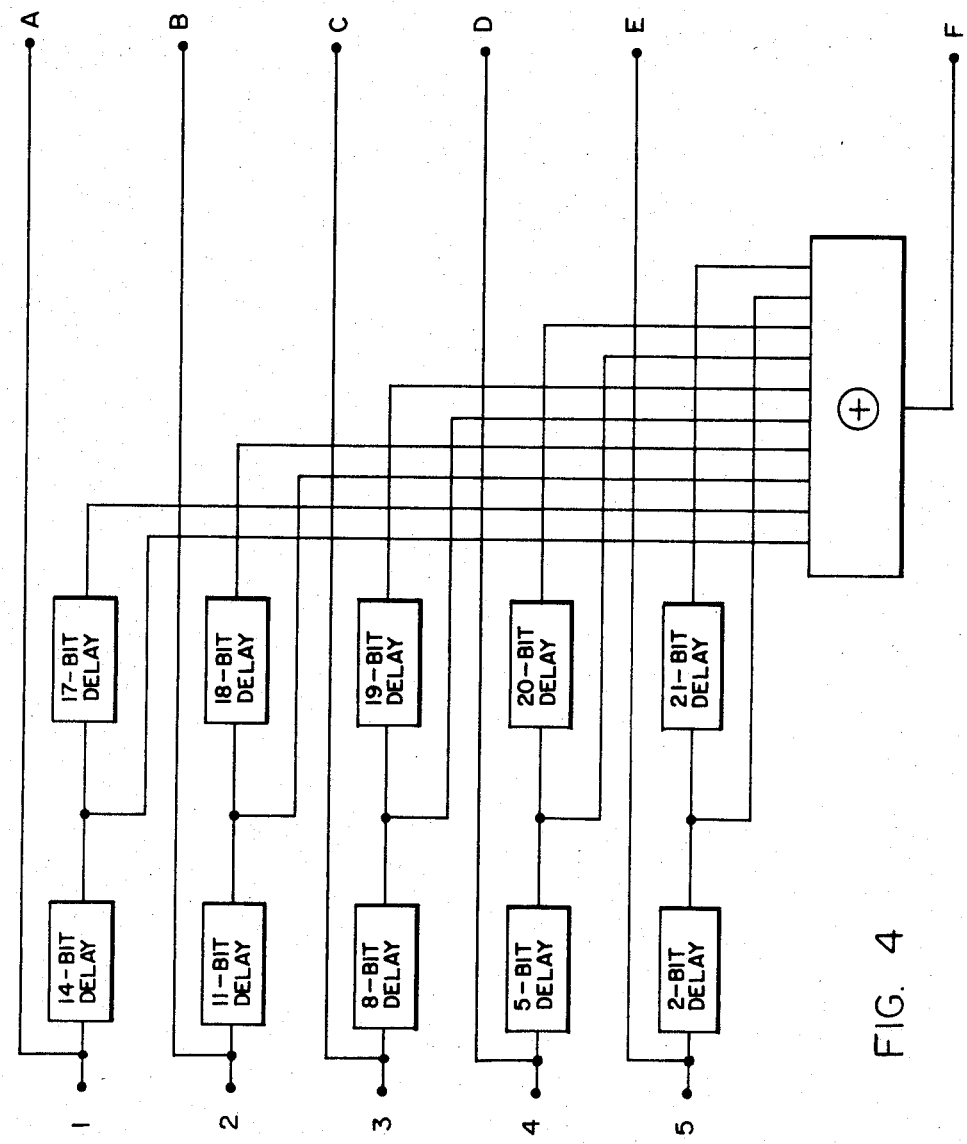
FIG. 4 is a detailed block diagram of the convolutional encoder used in the preferred embodiment of the invention.

FIG. 4 shows in more detail the convolutional encoder 10 used in this invention. Groups of five consecutive bits of the data train 40 are stored and then applied in parallel to inputs 1, 2, 3, 4 and 5 of the encoder 10. The current bits at input 1 through 5 are applied directly to outputs A through E, respectively, while a group of variously delayed bits from inputs 1 through 5 are added on a modulo-2 basis to produce the error check bit F. Outputs A through F are then taken four bits at a time and applied to the symbol generator 18.

Figure 6A:
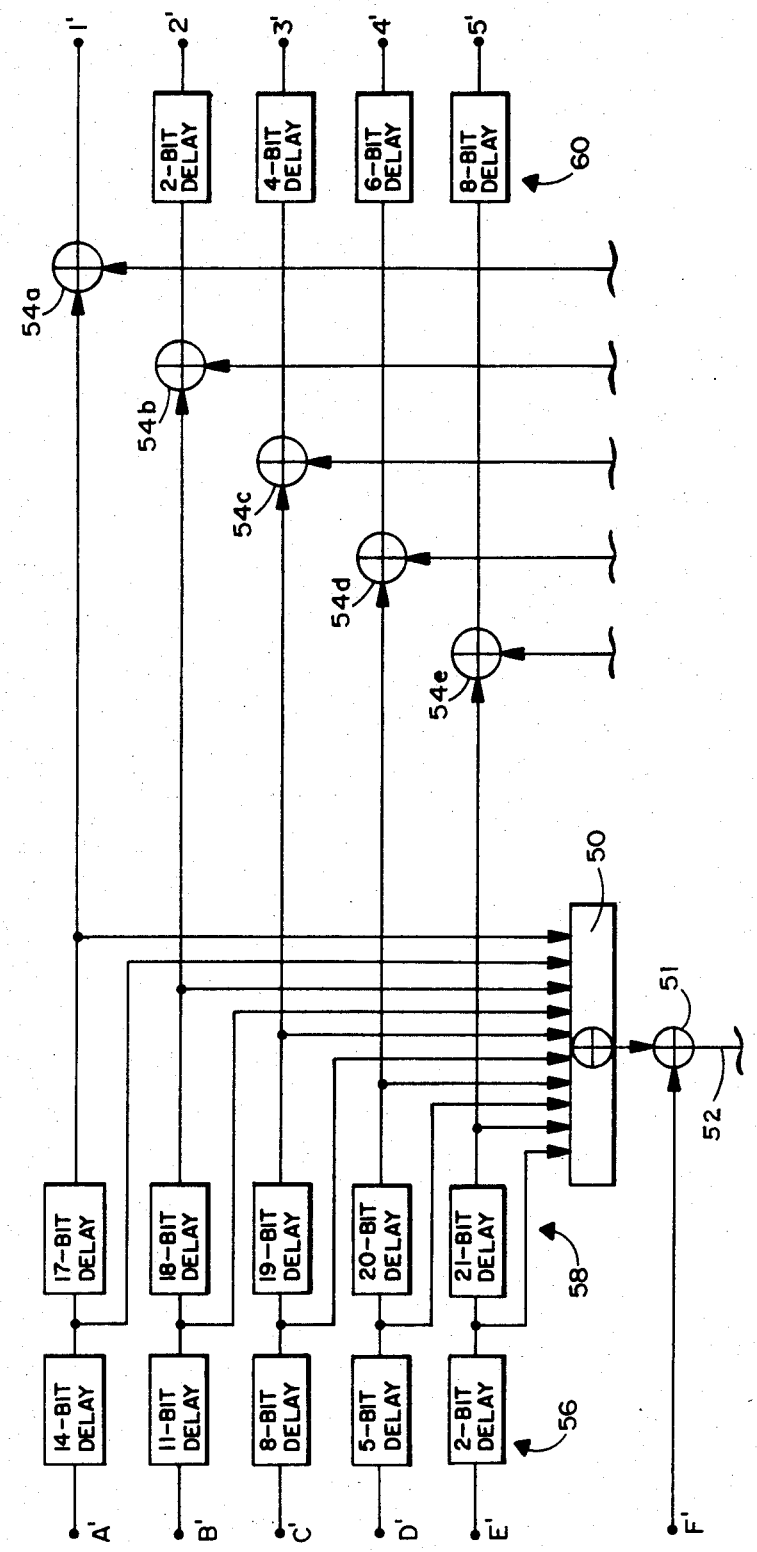
FIG. 6a is a detailed block diagram of the decoder/corrector portion of the convolutional decoder/error corrector of FIG. 3.
Figure 6B:
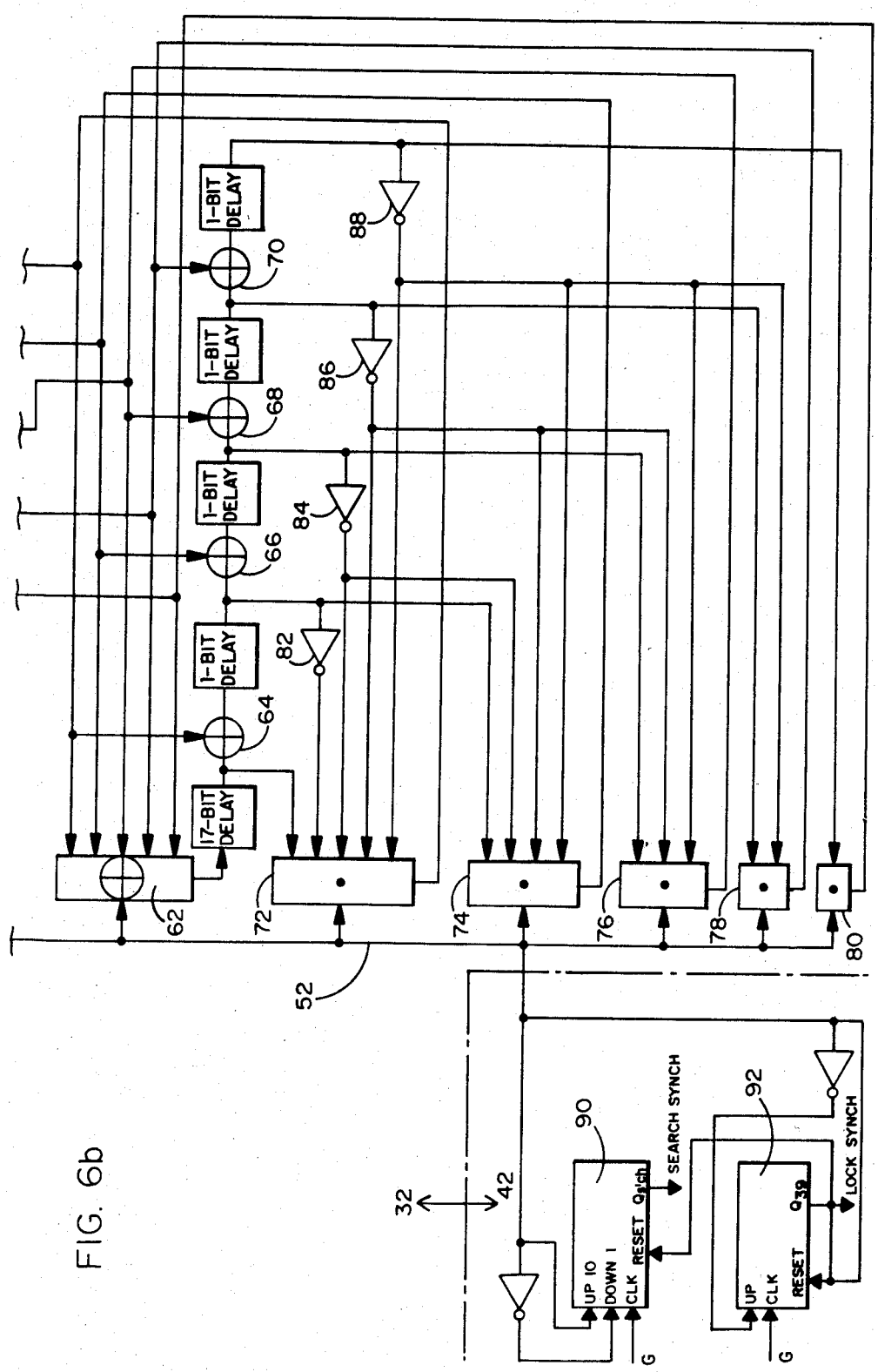
FIG. 6b is a detailed block diagram of the correction-generating portion of the convolutional decoder/error corrector and of the synch circuits of FIG. 3.

FIGS. 6a and 6b illustrate the error-correcting convolutional decoder 32 and synch circuit 42. Groups of six serially received bits A', B', C', D', E', and F' are stored and applied in parallel to the input of the decoder 32 (FIG. 6a). Variously delayed versions of bits A' through E' are added on a modulo-2 basis in adder 50. The output of adder 50 is modulo-2 added to F' in adder 51 to produce an error syndrome bit on line 52 whenever the output of adder 50 is different from F'.

As long as no errors are present, the modulo-2 adders 54a through 54e are inactive, and the outputs 1' through 5' are identical to the inputs A' through E', respectively, except for a 31-bit delay resulting from the combined action of delays 56, 58 and 60. Inasmuch as, in the absence of errors, A' through E' are identical to A through E of FIG. 3, outputs 1' through 5' will, under those circumstances, be identical to inputs 1 through 5 and will, when read serially, reproduce the data train 40.

Whenever an error occurs, the error-correcting circuitry (FIG. 6b) consisting of modulo-2 adders 62, 64, 66, 68, 70, AND gates 72, 74, 76, 78, 80, and inverters 82, 84, 86, 88 generates error-correcting bits which, when applied to modulo-2 adders 54a through 54e (FIG. 6a), correct the error before it reaches the outputs 1" through 5'. The algorithm by which this is accomplished is well known and is not material to this invention.

In the absence of errors, the output (FIG. 6b) of adder 51 on line 52 (i.e. the error syndrome bit) is 0. Whenever a five-bit group of data bits appearing at A' through E' contains an error, line 52 will see some "1"s. This causes the group (6-bit) clock G to register an up-count on counter 90. Conversely, a down-count occurs on counter 90 on each clock G if line 52 sees a "0". Preferably, the up-counts and down-counts are so weighted that it takes on the order of 10 "0"s on line 52 to compensate for each "1". If the net up-count exceeds a predetermined value indicating that the device's error-correcting capacity has been exceeded, the receiver 23 can be presumed to be out of synch, and the $Q_{sych}$ output of counter 90 initiates a resynchronization search.

When the correct timing and phase references have been found, and the modem functions normally, an uninterrupted sequence of, e.g. 39 error-free groups (195 bits, at which point the full error-correcting capacity of the FEC circuit of the preferred embodiment is re-established) causes the counter 92 to overflow and lock in the then existing phase and timing references.

It will thus be seen that the arrangement of this invention utilizes the full error-correcting capability of the FEC circuitry by eliminating the error-multiplying differential decoder, and by feeding error-free randomized data to the descrambler.

The arrangement of this invention has yet another advantage: A typical differential coder for a purely phase-shift keyed modem can only code two bits per symbol. With the addition of amplitude coding, three (see my U.S. Pat. No. 3,988,539) or more (as described herein) bits per vector are possible, but the potential for error increases. On the other hand, the more bits coded per vector, the lower the baud rate at which the vector symbols need to be transmitted; and the lower the baud rate, the less critical the quality of the telephone line. By eliminating error multiplication, the present invention makes practical the use of sixteen-element (four-bit) or even larger constellations, so that higher speed modems can be accommodated by low-grade telephone lines.

Although a (6,5) convolution (five information bits in each group of six transmitted bits) has been described herein, other convolutions can of course be used equally well for the FEC. However, in practice, the (6,5) convolution represents the best compromise between the conflicting requirements or low bandwidth increase, sufficient correction capability, and easy divisibility for round-number sampling rates for the V.22 bis specification.

We claim:

cLAIMS

1. In a vector-keyed modem receiver using forward error correction, the method of eliminating differential coding of received vectors comprising the steps of:
   a. decoding said received vectors with respect to a plurality of reference phases; and
   b. locking in the reference phase in which no substantial errors are detected during said forward error correction.

2. The method of preventing error multiplication in a V.22 bis modem, comprising the steps of:
   a. encoding a data bit train into bit groups containing data bits and error check bits;
   b. individually converting blocks of bits of said bit groups into vector symbols without reference to an adjacent symbol;
   c. transmitting a carrier modulated in accordance with said vector symbols;
   d. demodulating said carrier to derive said symbols therefrom;
   e. comparing said symbols to a selectable reference phase to reproduce said blocks of bits;
   f. decoding bit groups formed from said bit blocks to produce error syndrome bits when an error is present; and
   g. selecting the reference phase in which said error syndrome bits occur at less than a predetermined rate.

3. The method of claim 2, further comprising the step of:
   h. error-correcting said decoded bit groups to reproduce said data bit train in error-free form.

4. The method of claim 3, further comprising the steps of:
   i. scrambling said data bit train prior to the encoding thereof; and
   j. descrambling said data bit train after said error correction step.

5. A V.22 bis modem comprising:
   a. encoding means for converting a data bit train into bit groups containing data bits and error check bits;
   b. symbol generating means for producing signals representative of vector symbols defining phase and amplitude values, each of said symbols representing a block of bits;
   c. modulator means for modulating a carrier in accordance with said symbols, and transmitting the same;
   d. demodulator means for receiving said modulated carrier and deriving therefrom said symbols;
   e. symbol detecting means for reproducing the bit blocks defined by said symbols;
   f. error-correcting decoding means for producing an error syndrome bit when said error check bit does not match the data bits in its group, and for correcting said data bits to reproduce said data bit train; and g. synchronizing means for testing the possible reference phases for said symbols, and locking said symbol detecting means onto the reference phase which produces less than a predetermined error syndrome bit rate.

6. The modem of claim 5, further comprising:

h. scrambler means for scrambling said data bit train prior to application thereof to said encoding means; and i. descrambler means for receiving said reproduced scrambled data bit train from said error-correcting decoding means and descrambling said data bit train.

7. The modem of claim 5, in which said bit groups and said bit blocks are of different lengths, said synchronizing means further test the possible timing references for said symbols, and said synchronizing means lock said symbol detecting means onto the reference phase and timing combination which produces less than a predetermined error syndrome bit rate.

8. The modem of claim 5, in which said encoding and decoding means are of the convolutional type.

9. A vector-keyed modem having a receiver section for receiving data in the form of vectors, comprising:

(a) forward error correction means for producing error syndrome bits in the receiver section of said modem upon the occurrence of errors in the received data;

(b) reference means for selectively establishing phase references for the received vectors; and (c) synchronization means connected to said forward error correction means and said reference means for locking said reference means onto the phase reference which minimizes the rate of occurrence of said error syndrome bits.

* * * * *